US009676930B2

(12) United States Patent
Isoue et al.

(10) Patent No.: US 9,676,930 B2
(45) Date of Patent: Jun. 13, 2017

(54) POLYVINYL ACETAL FILM AND USES THEREOF

(75) Inventors: Koichiro Isoue, Kurashiki (JP); Yoshiaki Asanuma, Kurashiki (JP)

(73) Assignee: KURARAY CO., LTD., Okayama (JP)

( * ) Notice: Subject to any disclaimer, the term of this patent is extended or adjusted under 35 U.S.C. 154(b) by 586 days.

(21) Appl. No.: 13/637,758

(22) PCT Filed: Mar. 30, 2011

(86) PCT No.: PCT/JP2011/058117
§ 371 (c)(1),
(2), (4) Date: Nov. 29, 2012

(87) PCT Pub. No.: WO2011/125791
PCT Pub. Date: Oct. 13, 2011

(65) Prior Publication Data
US 2013/0074910 A1    Mar. 28, 2013

(30) Foreign Application Priority Data

Mar. 31, 2010  (JP) .................................. 2010-081059
Mar. 31, 2010  (JP) .................................. 2010-081060

(51) Int. Cl.
| C08L 29/14 | (2006.01) |
| B32B 17/10 | (2006.01) |
| C08K 5/10 | (2006.01) |
| C08K 5/11 | (2006.01) |
| H01L 31/04 | (2014.01) |
| C08J 5/18 | (2006.01) |
| C08F 16/38 | (2006.01) |
| H01L 31/048 | (2014.01) |
| C08K 5/103 | (2006.01) |
| C08F 6/26 | (2006.01) |
| C08K 5/13 | (2006.01) |

(52) U.S. Cl.
CPC ........ *C08L 29/14* (2013.01); *B32B 17/10036* (2013.01); *B32B 17/10605* (2013.01); *B32B 17/10678* (2013.01); *B32B 17/10688* (2013.01); *B32B 17/10761* (2013.01); *B32B 17/10871* (2013.01); *C08F 6/26* (2013.01); *C08F 16/38* (2013.01); *C08J 5/18* (2013.01); *C08K 5/10* (2013.01); *C08K 5/103* (2013.01); *C08K 5/11* (2013.01); *H01L 31/0481* (2013.01); *C08J 2329/14* (2013.01); *C08K 5/13* (2013.01); *Y02E 10/50* (2013.01)

(58) Field of Classification Search
CPC ........ B32B 17/10605; B32B 17/10761; B32B 17/10036; B32B 17/10871; C08F 6/26; C08F 16/38; C08K 5/10; C08K 5/11; C08K 5/103; C08K 5/13; C08L 29/14; H01L 31/0481; C08J 5/18; C08J 2329/14

USPC .......................................................... 524/308
See application file for complete search history.

(56) References Cited

U.S. PATENT DOCUMENTS

| 2,282,026 | A | | 5/1942 | Bren et al. |
| 5,019,624 | A | * | 5/1991 | Gutweiler et al. .............. 525/61 |
| 2005/0284516 | A1 | | 12/2005 | Koll |
| 2007/0148419 | A1 | | 6/2007 | Wiedemann et al. |
| 2010/0193023 | A1 | | 8/2010 | Karpinski et al. |
| 2010/0193024 | A1 | | 8/2010 | Karpinski et al. |
| 2010/0206374 | A1 | | 8/2010 | Karpinski et al. |
| 2011/0041897 | A1 | * | 2/2011 | Koll ................. B32B 17/10688 136/251 |
| 2011/0061714 | A1 | * | 3/2011 | Keller ............... B32B 17/10761 136/244 |
| 2012/0202070 | A1 | | 8/2012 | Asanuma et al. |
| 2012/0204940 | A1 | | 8/2012 | Asanuma et al. |
| 2012/0225287 | A1 | | 9/2012 | Keller et al. |

FOREIGN PATENT DOCUMENTS

| DE | 10 2008 001 502 A1 | 11/2009 |
| DE | 10 2008 001 505 A1 | 11/2009 |
| DE | 10 2008 001 507 A1 | 11/2009 |
| DE | 10 2008 001 512 A1 | 11/2009 |
| DE | 10 2008 042 218 A1 | 11/2009 |
| EP | 1 473 309 A1 | 11/2004 |

(Continued)

OTHER PUBLICATIONS

Extended European Search Report issued with respect to European Application No. 11765691.8, mail date is Jan. 16, 2014.

(Continued)

*Primary Examiner* — Michael M Bernshteyn
(74) *Attorney, Agent, or Firm* — Greenblum & Bernstein, P.L.C.

(57) ABSTRACT

A polyvinyl acetal film as an intermediate film for a laminated glass, can provide a laminated glass that exhibits a low degree of yellowness and excellent surface appearance, and is useful as a sealing material or intermediate film that can prolong the life of a laminated glass provided with a solar cell or functional unit. The content of corrosion-causing substance in the polyvinyl acetal film is low, so that the polyvinyl acetal film permits high-temperature lamination and ensures excellent productivity. A solar cell module and a laminated glass are prepared using the polyvinyl acetal film. A plasticized polyvinyl acetal film which comprises 15 to 60 parts by mass of a plasticizer having a total number of 28 or more of carbon atoms and oxygen atoms constituting a molecule based on 100 parts by mass of a polyvinyl acetal resin, and which has an acid value of 5.0 meq/kg or less.

16 Claims, 2 Drawing Sheets

(56) References Cited

FOREIGN PATENT DOCUMENTS

| | | |
|---|---|---|
| EP | 2 325 001 A1 | 5/2011 |
| EP | 2 463 336 A1 | 6/2012 |
| JP | 58-023870 | 2/1983 |
| JP | 61-069179 | 4/1986 |
| JP | 64-1737 | 1/1989 |
| JP | 06-177412 | 6/1994 |
| JP | 10-214987 | 8/1998 |
| JP | 2001-89520 A | 9/1999 |
| JP | 2001-72445 | 3/2001 |
| JP | 2004-250254 | 9/2004 |
| JP | 2006-013505 | 1/2006 |
| JP | 2006-047974 | 2/2006 |
| JP | 2007-162020 | 6/2007 |
| JP | 2008-222938 A | 9/2008 |
| WO | 2009/047221 | 4/2009 |
| WO | 2009/047222 | 4/2009 |
| WO | 2009/047223 | 4/2009 |
| WO | 2009/135928 | 11/2009 |
| WO | WO 2009132963 A2 * | 11/2009 |

OTHER PUBLICATIONS

International Search Report issued with respect to PCT/JP2011/058117, mailed May 10, 2011.
Office Action issued with respect to patent-family member Japanese Patent Application No. 2012-509545, mailed Sep. 4, 2012 with English-language translation thereof.
Office Action issued in European Patent Office (EPO) Counterpart Patent Appl. No. 11765691.8, dated Aug. 12, 2015.

* cited by examiner

POLYVINYL ACETAL FILM AND USES THEREOF

TECHNICAL FIELD

The present invention relates to a polyvinyl acetal film used for a laminate with glass such as a solar cell module and a laminated glass provided with an electrochromic function or an electroluminescence function containing a substance susceptible to corrosion by acid components, a method for producing the same, and a solar cell module and a laminated glass prepared using the film.

BACKGROUND ART

Solar cell modules generally have a photosensitive semiconductor layer (hereinafter may be referred to as a solar cell unit) having a transparent cover for protecting against external influences. Such solar cell units are often disposed between a glass plate and a hard cover plate such as glass or a back sheet, and fixed with a sealing material adhesive to glass.

Since solar cell units are extremely fragile, cross-linkable sealing materials composed of an ethylene-vinyl acetate copolymer (hereinafter may be referred to as EVA) or a curable casting resin as a base have been used as described, for example, in Japanese Patent Application Laid-Open No. 1983-023870 (Patent Literature 1) or Japanese Patent Application Laid-Open No. 1994-177412 (Patent Literature 2). In an uncured state, the viscosity of these sealing materials may be adjusted to be low so that the solar cell unit is covered with the material. After covering the solar cell unit in that way, a cross-linking reaction by a curing agent or a cross-linking agent allows the sealing material to possess a certain level of mechanical strength. In solar cell modules using EVA, however, there is a problem of corrosion of metal components caused by acetic acid formed by hydrolysis or thermal decomposition of EVA. Moreover, due to the low viscosity before curing, EVA also has a problem of flowing from the edge of glass to contaminate laminators and glass surfaces. As for the curable casting resin, embedding of solar cell units and control of curing is extremely difficult, and the resin often causes problems such as generation of bubbles or peeling several years after the manufacture of the solar cell module. Therefore, few curable casting resins have been used as a sealing material for solar cells.

Also, as described in Japanese Patent Application Laid-Open No. 2006-013505 (Patent Literature 3), etc., a film composed of thermoplastic polyvinyl butyral (hereinafter may be referred to as PVB) resin as a base is used as a sealing material. Since the content of acetic acid residue which forms an acid component is low in PVB, PVB has an advantage that corrosion of metal components is less likely to occur as compared to EVA. Further, since PVB is thermoplastic, it is highly viscous at a flow-starting temperature, and thus the resin is less likely to flow from the edge of glass to contaminate devices or glass surfaces. Moreover, from the standpoint of mechanical strength, film containing PVB resin has excellent adhesiveness to glass and penetration resistance, and thus is useful as an intermediate film for car windshields and architectural laminated safety glass.

Generally, when using polyvinyl acetal such as polyvinyl butyral as a sealing material for a solar cell or an intermediate film for laminated glass, a plasticizer is added. Examples of plasticizers used include an acrylic polymer having a number average molecular weight of 1000 or more and a weight average molecular weight of 2000 or more, which is described, for example, in Japanese Patent Application Laid-Open No. 2004-250254 (Patent Literature 4). Also, Patent Literature 4 describes that since laminated glass used for car, aircraft or building windows is generally produced by a vacuum bag or vacuum ring process performed at a relatively low degree of vacuum, or by a nip roll process or a heat press process at ordinary pressure, low molecular weight volatile substances cause some problems. Further, International Publication No. WO2009/135928 (Patent Literature 5) discloses a plasticized polyvinyl acetal film containing 10 to 40% by mass of cyclohexane dicarboxylic acid ester (e.g., cyclohexane dicarboxylic acid diisononyl ester) and having a Tg of 74° C. or less. The plasticizer has excellent compatibility with polyvinyl acetal film and thus can provide a film capable of maintaining flexibility even in cold conditions.

Methods using a vacuum laminator performed under high vacuum conditions are described in Japanese Patent Application Laid-Open No. 1998-214987 (Patent Literature 6) and Japanese Patent Application Laid-Open No. 1986-069179 (Patent Literature 7).

For polyvinyl acetal resin with a low volatile component content, Japanese Patent Application Laid-Open No. 2001-072445 (Patent Literature 8), for example, describes an intermediate film for laminated glass in which the total content of volatile substances after being left in an atmosphere at 100° C. for 1 hour is 30 ppm or less. Also, Japanese Patent Application Laid-Open No. 2006-047974 (Patent Literature 9) describes a polyvinyl acetal resin for a heat developable photosensitive material having a 2-ethyl-2-hexenal content of 60 ppm or less.

CITATION LIST

Patent Literature

Patent Literature 1: Japanese Patent Application Laid-Open (JP-A) No. 1983-023870
Patent Literature 2: JP-A No. 1994-177412
Patent Literature 3: JP-A No. 2006-013505
Patent Literature 4: JP-A No. 2004-250254
Patent Literature 5: International Publication No. WO2009/135928
Patent Literature 6: JP-A No. 1998-214987
Patent Literature 7: JP-A No. 1986-069179
Patent Literature 8: JP-A No. 2001-072445
Patent Literature 9: JP-A No. 2006-047974

DISCLOSURE OF THE INVENTION

Problem to be Solved by the Invention

The biggest problem with current solar cell modules is to realize power generation cost equivalent to or less than the power generation cost in thermal or nuclear power generation. Important factors for reducing the cost include reducing production loss, improving productivity and ensuring long term stability of solar cell modules. To reduce the production loss, it is important to reduce failure or contamination of lamination equipment. To improve productivity, methods of increasing lamination temperature may be used. Furthermore, to achieve long term stability, in other words, long life, of solar cell modules, it is important to suppress the corrosion of metal including electrodes. The most important factor that affects corrosion is acid components. Unlike EVA film, polyvinyl acetal film contains only a small amount of carboxylic acid ester which forms carboxylic acid by hydrolysis or thermal decomposition. However, aldehydes derived from raw materials remain in the film, and these components are transformed into carboxylic acid by oxidation. It has also been found that hydrolysis or thermal decomposition of plasticizer contained in polyvinyl acetal film results in the formation of carboxylic acid components to cause corrosion.

Accordingly, in view of the problem of reducing production loss, improving productivity and ensuring long term stability of solar cell modules, the present inventors have focused on and studied the acid value of polyvinyl acetal film used as a sealing material.

Patent Literatures 1-9 do not describe low acid value polyvinyl acetal film. Moreover, the literatures neither describe nor suggest that such specific polyvinyl acetal film is preferably used as a sealing material for solar cells, which is susceptible to corrosion particularly by acid.

Specifically, the PVB resin described in Patent Literature 3 contains a carboxylic acid component derived from aldehyde that has been used, a carboxylic acid component such as acetic acid formed by hydrolysis or thermal decomposition of polymer, a terminal carboxylic acid component formed by oxidation/cleavage of polymer and a carboxylic acid component formed by hydrolysis or thermal decomposition of plasticizer. Such carboxylic acid components cause decrease in power generation efficiency or electroluminescent ability when using a solar cell or a laminated glass provided with other functional units for long time.

In the case of solar cell modules provided with a solar cell or a functional unit in the interior or a functional laminated glass provided with a unit having irregularities in the interior, efficient production by the method described in Patent Literature 4 is difficult. Also, the methods disclosed in Patent Literatures 6 and 7 describe only examples of using EVA film, and do not describe any example or conditions of application to polyvinyl acetal film.

Furthermore, since heating is performed in vacuum at about 120 to 160° C. in the lamination step in the production of solar cell modules, even by using polyvinyl acetal resin described in Patent Literature 8 which contains a small amount of substances volatile at 100° C., it is impossible to suppress the amount of volatile substances at higher temperatures. Moreover, Patent Literature 8 is aimed at reducing odor and does not describe the generation of bubbles, burden on laminators or corrosion of solar cells and functional laminated glass, that are to be solved in the present invention. And Patent Literature 9 does not describe polyvinyl acetal resin film or a laminated glass or a solar cell using the same.

Accordingly, an object of the present invention is to provide a low acid value polyvinyl acetal film which contains a small amount of corrosion-causing substances, leaves few bubbles in lamination to reduce the corrosion of laminators and reduce the burden on vacuum pumps for lamination, and which can offer high productivity without contaminating vacuum laminators or the resulting modules by volatile components. At the same time, a solar cell module and a laminated glass using the same are provided.

Means for Solving Problem

The above problems will be solved by a plasticized polyvinyl acetal film which comprises 15 to 60 parts by mass of a plasticizer having a total number of 28 or more of carbon atoms and oxygen atoms constituting a molecule based on 100 parts by mass of a polyvinyl acetal resin, and which has an acid value of 5.0 meq/kg or less.

Also, the above problems will be solved by a plasticized polyvinyl acetal film which comprises 15 to 60 parts by mass of a plasticizer based on 100 parts by mass of a polyvinyl acetal resin, and which has an acid value after heating at 140° C. for 4 hours of 10.0 meq/kg or less. It is preferable that the plasticizer has a total number of 28 or more of carbon atoms and oxygen atoms constituting a molecule and the film has an acid value of 5.0 meq/kg or less.

It is preferable that the plasticizer has a total number of more than 29 of carbon atoms and oxygen atoms constituting a molecule.

It is preferable that the plasticizer is represented by the following chemical formula (1):

$$R^2-X-R^1-Y-R^3 \qquad (1)$$

in which $R^1$ is a divalent saturated hydrocarbon group optionally containing an oxygen atom, $R^2$ and $R^3$ are a linear or branched saturated hydrocarbon group optionally containing an oxygen atom, which may be the same or different, and X and Y are a COO or OCO bond, which may be the same or different.

It is preferable that the plasticized polyvinyl acetal film contains a total of 50 ppm or less of chloride ions, sulfate ions, and nitrate ions.

It is preferable that the polyvinyl acetal resin has an acid value of 3.0 meq/kg or less and the plasticizer has an acid value of 10.0 meq/kg or less.

It is preferable that the polyvinyl acetal resin has an acid value after heating at 140° C. for 4 hours of 10.0 meq/kg or less.

The above problems will be solved also by a method for producing a plasticized polyvinyl acetal film, comprising mixing 15 to 60 parts by mass of a plasticizer having a total number of 28 or more of carbon atoms and oxygen atoms constituting a molecule with 100 parts by mass of a polyvinyl acetal resin and molding.

It is preferable that in the method, the plasticizer has a total number of more than 29 of carbon atoms and oxygen atoms constituting a molecule. It is preferable that the polyvinyl acetal resin has an average primary particle size of 10 μm or less. It is preferable that the polyvinyl acetal resin has an alkali titer value of 0.1 to 30 and an acid value of 3.0 meq/kg or less. Further, it is preferable that the polyvinyl acetal resin contains a total of 100 ppm or less of chloride ions, sulfate ions, and nitrate ions.

It is preferable that in the method for producing a plasticized polyvinyl acetal film, a polyvinyl acetal resin is prepared by first adding aldehyde to an aqueous solution of a polyvinyl alcohol resin and then adding a catalyst. It is preferable that a plasticizer having an acid value of 10.0 meq/kg or less is mixed with a polyvinyl acetal resin having an acid value of 3.0 meq/kg or less and the mixture is molded.

It is preferable that in the method for producing a plasticized polyvinyl acetal film, the polyvinyl acetal resin and the plasticizer are mixed with removing a volatile component by reducing pressure.

It is preferable that in the method for producing the plasticized polyvinyl acetal film, the temperature of the resin in molding ranges from 150 to 220° C.

The present invention also includes a solar cell module using the above plasticized polyvinyl acetal film. It is preferable that the solar cell module further comprises glass provided with a transparent conductive film layer.

The present invention also includes a laminated glass using the above plasticized polyvinyl acetal film. It is preferable that the laminated glass further comprises a functional unit at a position in contact with the film.

Effect of the Invention

The plasticized polyvinyl acetal film of the present invention is preferably used for a glass laminate such as a solar cell module and a laminated glass provided with an electrochromic function or an electroluminescence function containing a substance susceptible to corrosion by acid components. When used as an intermediate film for a laminated glass, the plasticized polyvinyl acetal film of the present invention described above can provide a laminated glass which exhibits a low degree of yellowness and excellent appearance. The plasticized polyvinyl acetal film of the present invention permits high-temperature lamination and thus ensures excellent productivity, and also can prolong the life of the resulting solar cell module.

BEST MODES FOR CARRYING OUT THE INVENTION

Figure 1:
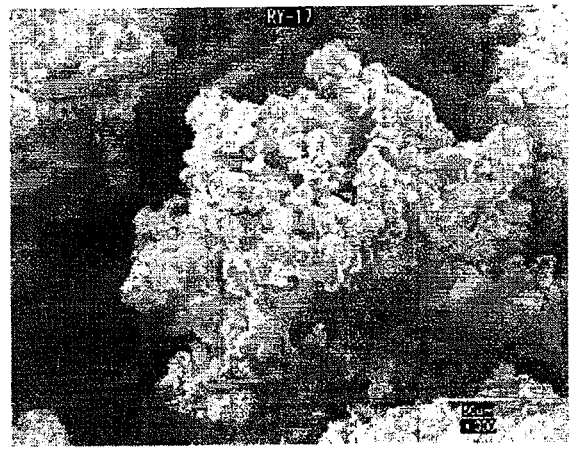
FIG. 1 is an SEM image of PVB-1 prepared in Preparation Example 1.

In one embodiment of the plasticized polyvinyl acetal film of the present invention, the film comprises 15 to 60 parts by mass of a plasticizer having a total number of 28 or more of carbon atoms and oxygen atoms constituting a molecule based on 100 parts by mass of a polyvinyl acetal resin. In another embodiment of the plasticized polyvinyl acetal film of the present invention, the film comprises 15 to 60 parts by mass of a plasticizer based on 100 parts by mass of a polyvinyl acetal resin and has an acid value after heating at 140° C. for 4 hours of 10.0 meq/kg or less.

Polyvinyl Acetal Resin

The polyvinyl acetal resin used in the present invention has a vinyl alcohol unit content measured in accordance with the method of JIS K6728:1977 of preferably 12 to 34% by mole, more preferably 15 to 32% by mole, and further preferably 18 to 30% by mole. When the vinyl alcohol unit content is more than 34% by mole, the resin is more hygroscopic, and water absorbed is likely to cause corrosion of metal, decrease in insulation properties and separation of plasticized polyvinyl acetal film from substrates. On the other hand, when the vinyl alcohol unit content is less than 12% by mole, problems are likely to be caused such as decrease in mechanical strength and poor adhesion to substrates.

The polyvinyl acetal resin used in the present invention has a vinyl acetate unit content measured in accordance with the method of JIS K6728:1977 of preferably 4% by mole or less, more preferably 2% by mole or less, and further preferably 1% by mole or less. When the vinyl acetate unit content is more than 4% by mole, acetic acid, which is a corrosive substance, is likely to be formed due to thermal decomposition or hydrolysis with water. Moreover, the polyvinyl acetal resin is more likely to be colored due to the generation of olefin caused by elimination of acetic acid.

The polyvinyl acetal resin used in the present invention has a melt flow rate measured at a load of 21.6 kg at 150° C. (a 2 mm nozzle) of preferably 15 to 40 g/10 minutes, and more preferably 20 to 35 g/10 minutes. Furthermore, the polyvinyl acetal resin has a melt flow rate measured at 120° C. of preferably 0.5 to 5 g/10 minute, and more preferably 1 to 4 g/10 minute. Moreover, the polyvinyl acetal resin has a melt flow rate measured at 100° C. of preferably 0.05 to 1 g/10 minute, and more preferably 0.10 to 0.6 g/10 minute.

The polyvinyl acetal resin is decomposed by acid in the presence of water to form aldehyde, and therefore it is preferable to adjust alkali titer values to a positive value. The polyvinyl acetal resin after alkaline washing has an alkali titer value of preferably 0.1 to 30, more preferably 1 to 20, and further preferably 1 to 10. When the polyvinyl acetal resin has an alkali titer value or less than 0.1, hydrolysis resistance is likely to be decreased. On the other hand, when the polyvinyl acetal resin has an alkali titer value of more than 30, coloring of the film is likely to occur in the production. Here the alkali titer value (mL) is defined by the amount of 0.01 mole/L hydrochloric acid necessary for the titration of alkali in 100 g of the polyvinyl acetal resin.

The polyvinyl acetal resin has an acid value of preferably 3.0 meq/kg or less, more preferably 1.5 meq/kg or less, further preferably 1.0 meq/kg or less, and particularly preferably 0.7 meq/kg or less. When the polyvinyl acetal resin has an acid value of more than 3.0 meq/kg, it is likely that the resulting plasticized polyvinyl acetal film contains a larger amount of acid components to cause coloring, and electrodes of solar cells and the like using the plasticized polyvinyl acetal film are corroded to decrease the life. Herein the acid value is measured in accordance with the method of JIS K6728:1977. Examples of methods of adjusting the acid value of polyvinyl acetal resin to 3.0 meq/kg or less include a method comprising first adding aldehyde to an aqueous solution of polyvinyl alcohol resin which is a raw material of polyvinyl acetal resin, and then adding a catalyst at low temperature, a method of preparing an easy-to-wash porous polyvinyl acetal resin by increasing stirring efficiency or by using a surfactant, a method in which a water-soluble organic solvent is used together at the time of water washing after the reaction, a method of adding a compound that readily reacts with acid, such as an epoxy compound, and a method in which resin is dissolved in a solvent and purified by using a dialysis membrane or the like. Of them, from the viewpoint of simplifying processes, the method of preparing a porous polyvinyl acetal resin is preferred, and the method comprising first adding aldehyde and then adding a catalyst at low temperature is particularly preferably used.

The total amount of chloride ions, sulfate ions, and nitrate ions contained in the polyvinyl acetal resin used in the present invention, which are derived from an acetalization catalyst, is preferably 100 ppm or less, more preferably 50 ppm or less, and further preferably 20 ppm or less. When the content of these strong acid ions is more than 100 ppm, metal components used for solar cell modules may be corroded.

The polyvinyl acetal resin used in the present invention is produced using a polyvinyl alcohol resin and aldehyde by a known method.

The polyvinyl alcohol resin may be prepared, for example, by polymerizing a vinyl ester monomer and saponifying the resulting polymer. As the method of polymerizing a vinyl ester monomer, known methods such as a solution polymerization method, a bulk polymerization method, a suspension polymerization method and an emulsion polymerization may be used. As the polymerization initiator, an azo type initiator, a peroxide type initiator or a redox type initiator may be selected depending on the polymerization method. Referring to the saponification reaction, known alchoholysis or hydrolysis using an alkali catalyst or an acid catalyst may be employed. Of these, saponification reaction using methanol as a solvent and caustic soda (NaOH) as a catalyst is simple and most preferred. The saponification degree of the polyvinyl alcohol resin used in the present invention is not particularly limited, and in consideration of the reduction of the amount of carboxylic acid generated by decomposition, the polyvinyl alcohol resin has a saponification degree of preferably 95% by mole or more, more preferably 98% by mole or more, and further preferably 99% by mole or more.

Examples of the vinyl ester monomers include vinyl formate, vinyl acetate, vinyl propionate, vinyl butyrate, vinyl isobutyrate, vinyl pivalate, vinyl versatate, vinyl caproate, vinyl caprylate, vinyl laurate, vinyl palmitate, vinyl stearate, vinyl oleate, and vinyl benzoate, and vinyl acetate is particularly preferred.

When the vinyl ester monomers are polymerized, they may be copolymerized with other monomers as long as the objects of the present invention are not impaired. Examples of the other monomers include: α-olefins such as ethylene, propylene, n-butene, and isobutylene; acrylic acid and its salts; acrylic acid esters such as methyl acrylate, ethyl acrylate, n-propyl acrylate, i-propyl acrylate, n-butyl acrylate, i-butyl acrylate, t-butyl acrylate, 2-ethylhexyl acrylate, dodecyl acrylate, and octadecyl acrylate; methacrylic acid and its salts; methacrylic acid esters such as methyl methacrylate, ethyl methacrylate, n-propyl methacrylate, i-propyl methacrylate, n-butyl methacrylate, i-butyl methacrylate, t-butyl methacrylate, 2-ethylhexyl methacrylate, dodecyl methacrylate, and octadecyl methacrylate; acrylamide; acrylamide derivatives such as N-methylacrylamide, N-ethylacrylamide, N,N-dimethylacrylamide, diacetoneacrylamide, acrylamide propanesulfonic acid and its salts, acrylamide propyldimethylamine and its acid salts or its quaternary salts, and N-methylol acrylamide and its derivatives; methacrylamide; methacrylamide derivatives such as N-methylmethacrylamide, N-ethylmethacrylamide, methacrylamide propanesulfonic acid and its salts, methacrylamide propyldimethylamine and its acid salts or its quaternary salts, and N-methylol methacrylamide and its derivatives; vinyl ethers such as methyl vinyl ether, ethyl vinyl ether, n-propyl vinyl ether, i-propyl vinyl ether, n-butyl vinyl ether, i-butyl vinyl ether, t-butyl vinyl ether, dodecyl vinyl ether, and stearyl vinyl ether; nitriles such as acrylonitrile and methacrylonitrile; vinyl halides such as vinyl chloride and vinyl fluoride; vinylidene halides such as vinylidene chloride and vinylidene fluoride; allyl compounds such as allyl acetate and allyl chloride; unsaturated dicarboxylic acids such as maleic acid, itaconic acid and fumaric acid and its salts or its esters or its anhydrides; vinylsilyl compounds such as vinyltrimethoxysilane; and isopropenyl acetate. These monomers usually are used in an amount of less than 20 mol %, preferably less than 10 mol % relative to vinyl ester monomers.

When the vinyl ester monomers are polymerized, they may be polymerized in the presence of thiol compound such as thioacetic acid and mercaptopropionic acid or other chain transfer agents.

For aldehydes in the present invention, an aldehyde compounds having 1 to 12 carbon atoms are usually used. Preferred are satisfied-alkyl aldehyde compounds having 1 to 6 carbon atoms, and more preferably satisfied-alkyl aldehyde compounds having 1 to 4 carbon atoms are used. Examples of above aldehyde compounds include formaldehyde, acetaldehyde, propionaldehyde, butylaldehyde, hexylaldehyde and benzaldehyde. These aldehydes may be used alone, or two or more of them may be used in combination. Further, aldehydes such as multifunctional aldehydes and aldehydes including other functional group may be used in combination with the above-aldehydes in an amount of less than 20 wt % relative to all amount of aldehydes used. Among them, n-butyl aldehyde is preferred from the view point of physical property in use of solar cell or a laminated glass.

Methods for preparing polyvinyl acetal resin are not particularly limited, and examples thereof include a method in which an aldehyde compound is allowed to react in a polyvinyl alcohol resin solution in an acidic condition.

Solvents for preparing the polyvinyl acetal resin are not particularly limited, and for industrial mass production, water is preferably used. It is preferable that the polyvinyl alcohol resin is dissolved sufficiently before the reaction at high temperatures, for example, 90° C. or more. The aqueous solution has a concentration of preferably 5 to 40% by mass, more preferably 5 to 20% by mass, and further preferably 8 to 15% by mass. When the concentration is less than 5% by mass, productivity is likely to be poor. When the concentration is more than 40% by mass, stirring in the reaction is difficult, and it is likely that gelation of polyvinyl alcohol resin occurs due to intermolecular hydrogen bonding, causing uneven reaction.

Catalysts for allowing aldehyde to react with the aqueous polyvinyl alcohol resin solution are not particularly limited, and an organic acid or an inorganic acid may be used. Examples thereof include acetic acid, para-toluenenesulfonic acid, nitric acid, sulfuric acid, hydrochloric acid and carbonic acid. Of these, inorganic acids are preferred, and hydrochloric acid, sulfuric acid and nitric acid are particularly preferred because sufficient reaction speed is obtained and washing after the reaction is easy. The concentration of acid used for the reaction depends on the types of acids to be used, and in the case of hydrochloric acid, sulfuric acid and nitric acid, the concentration is preferably 0.01 to 5 moles/L, and more preferably 0.1 to 2 moles/L. When the concentration of acid is less than 0.01 mole/L, it is likely that the reaction speed is low and it takes long time to obtain a polyvinyl butyral resin with the intended acetalization degree and the intended properties. When the concentration of acid is more than 5 moles/L, it is likely that controlling the reaction is difficult and aldehyde dimers and trimers are easily formed.

Examples of procedures of the reaction include known methods such as a method comprising adding the above catalyst to an aqueous polyvinyl alcohol resin solution and then adding aldehyde, and a method comprising first adding aldehyde and then adding the above catalyst. Of them, the method comprising first adding aldehyde and then adding the above catalyst is preferable because the method allows the acid value of the polyvinyl acetal resin to be lower. Examples also include a method of adding aldehyde or acid catalyst to be added collectively, sequentially or in installments, and a method of adding a mixed solution of an aqueous polyvinyl alcohol solution and aldehyde or acid catalyst to a solution containing acid catalyst or aldehyde.

The reaction temperature is not particularly limited, and in consideration of the step of producing film described later, it is preferable to prepare a porous polyvinyl acetal resin which is easy to wash after the reaction. To obtain such polyvinyl acetal resin, the reaction is performed at a relatively low temperature of preferably 0 to 40° C., more preferably 5 to 20° C. until polyvinyl acetal particles precipitate in the reaction. When the reaction temperature exceeds 40° C., it is likely that the polyvinyl acetal resin is fused and not porous. Subsequently, to accelerate the reaction and improve the productivity, the reaction temperature is set at preferably 50 to 80° C., and more preferably 65 to 75° C.

As describe above, it is preferable that particles of the polyvinyl acetal resin are porous in order to remove the remaining acid and aldehyde efficiently. In particular, the polyvinyl acetal resin has an average primary particle size of preferably 10 μm or less, more preferably 5 μm or less. When the polyvinyl acetal resin has an average primary particle size of more than 10 μm, the acid component remaining in the particle is difficult to be removed, and therefore the resulting resin has a higher acid value, and metal corrosion tends to develop when the resin is used as a sealing material for solar cells. Further, it is preferable that primary particles are kept porous without being excessively fused with each other. Excessive fusion of primary particles results in loss of porous structures, making it difficult to remove acid remaining in the interior. To prepare a porous polyvinyl acetal resin, it is important to adjust not only the reaction temperature but also the viscosity of the reaction solution, the stirring rate, the shape of impellers, the shape of reactors, the reaction speed and the method of adding catalyst and aldehyde.

Examples of methods of removing the remaining aldehyde and acid catalyst after the reaction include known methods. For example, the polyvinyl acetal resin prepared by the reaction is neutralized by an alkaline compound, and it is preferable to remove as much of the aldehyde remaining in the resin as possible before the alkali neutralization. Therefore, a method of facilitating reaction in a condition of increasing the reaction rate of aldehyde, a method of washing sufficiently with water or a water/alcohol mixed solvent, and a method of chemically treating aldehyde are useful. Examples of alkaline compounds used for alkali neutralization include alkali metal hydroxide such as sodium hydroxide and potassium hydroxide and amine compounds such as ammonia, triethylamine and pyridine. Of them, in consideration of the reduction of coloring, hydroxides of inorganic metal are preferred, and alkali metal hydroxides that have little influence on the adhesiveness with glass are particularly preferred.

Plasticizer

The plasticizer used in the present invention has a total number of carbon atoms and oxygen atoms constituting a molecule of preferably 28 or more, more preferably more than 29, further preferably more than 30, and particularly preferably more than 31. When the plasticizer has a total number of less than 28 of carbon atoms and oxygen atoms constituting a molecule, the acid value is more likely to be increased due to thermal decomposition or hydrolysis, causing an increase in the acid concentration in the plasticized polyvinyl acetal film. Further, the plasticizer vaporizes when the temperature of vacuum laminators is high or high vacuum is formed, and this extends the time for lamination and results in not only poor productivity but also higher acid concentration in the plasticized polyvinyl acetal film.

The plasticizer used in the present invention has a vapor pressure at 200° C. of preferably 1.9 mmHg or less, more preferably 1.0 mmHg or less, and further preferably 0.5 mmHg or less. When the plasticizer has a vapor pressure of more than 1.9 mmHg, the plasticizer vaporizes in the vacuum lamination step to form bubbles in the resulting solar cell module or laminated glass, and this may also cause contamination of laminators and damage in vacuum pumps.

The polyvinyl acetal resin used in the present invention has an acid value of preferably 10.0 meq/kg or less, more preferably 5.0 meq/kg or less, further preferably 3.0 meq/kg or less, and particularly preferably 1.0 meq/kg or less. When the polyvinyl acetal resin has an acid value of more than 10.0 meq/kg, in some cases the plasticized polyvinyl acetal film is colored, cracked gas is generated, or the resulting solar cells, etc., have short life. Here, the acid value is measured in accordance with the method of JIS K6728:1977. The acid value of the plasticizer is generally determined by the structure, and it is also preferable to remove acid components contained as impurities by treatment such as distillation, adsorption, reaction or washing, before mixing with polyvinyl acetal resin. In that case, the treatment will be more effective when a plasticizer having an acid value of 0.5 to 10 meq/kg is used.

Preferably, the plasticizer used in the present invention is represented by the following chemical formula (1):

$$R^2\text{---}X\text{---}R^1\text{---}Y\text{---}R^3 \qquad (1)$$

in which $R^1$ is a divalent saturated hydrocarbon group optionally containing an oxygen atom, $R^2$ and $R^3$ are a linear or branched saturated hydrocarbon group optionally containing an oxygen atom, which may be the same or different, and X and Y are a COO or OCO bond, which may be the same or different. $R^1$, $R^2$ and $R^3$ may contain, for example, an ether bond. The total number of carbon atoms and oxygen atoms constituting $R^1$ is preferably 4 to 32, and more preferably 6 to 20. When the total number of carbon atoms and oxygen atoms constituting $R^1$ is less than 4, the plasticizer is likely to be more volatile, and when the total number is more than 32, the plasticizing effect is likely to be low. On the other hand, the total number of carbon atoms and oxygen atoms constituting $R^2$ and $R^3$ is preferably 4 to 32, more preferably 8 to 20, and further preferably 10 to 15. When the total number of carbon atoms and oxygen atoms constituting $R^2$ and $R^3$ is less than 4, the plasticizer is likely to be more volatile and have low degree of freedom, and therefore the plasticizing effect is likely to be low. When the total number is more than 32, the number of moles of the plasticizer per unit mass is decreased, and therefore the plasticizing effect is also likely to be low.

Any plasticizer generally used can be employed in the present invention. Examples of the plasticizers include oligoethylene glycol-di-(2-ethylhexanoate) having the average repeating unit of ethylene glycol (represented as n) is 5 or more (for example, n=9; 9GO), triethylenglycol-di-(2-ethylhexanoate) (3 GO), tetraethylene glycol-di-(2-ethylhexanoate), di-(2-butoxyethyl)-adipate (DBEA), di-(2-butoxyethyl)-sebacate (DBES), di-(2-butoxyethyl)-azelate, di-(2-butoxyethyl)-glutarate, di-(2-butoxyethoxyethyl)-adipate (DBEEA), di-(2-butoxyethoxyethyl)-sebacate (DBEES), di-(2-butoxyethoxyethyl)-azelate, di-(2-butoxyethoxyethyl)-glutarate, di-(2-hexoxyethyl)-adipate, di-(2-hexoxyethyl)-sebacate, di-(2-hexoxyethyl)-azelate, di-(2-hexoxyethyl)-glutarate, di-(2-hexoxyethoxyethyl)-adipate, di-(2-hexoxyethoxyethyl)-sebacate, di-(2-hexoxyethoxyethyl)-azelate, di-(2-hexoxyethoxyethyl)-glutarate, cyclohexane dicarboxylic acid diisononyl ester (DINCH), di-(2-butoxyethyl)-phthalate and di-(2-butoxyethoxyethyl)-phthalate. These plasticizers may be used alone, or two or more of them may be used in combination. Among them, preferred is the plasticizers whose total number of the carbon atom and oxygen atom which constitute a molecule is 28 or more, because these plasticizers, in particular, can lessen the acid value of the plasticized polyvinyl acetal film after heating (disclosed later). Examples such plasticizers include, for example, oligoethylene glycol-di-(2-ethylhexanoate) having the average repeating unit of ethylene glycol (represented as n) is 5 or more (for example, n=9; 9GO), triethylenglycol-di-(2-ethylhexanoate) (3GO), tetraethylene glycol-di-(2-ethylhexanoate), di-(2-butoxyethyl)-adipate (DBEA), di-(2-butoxyethyl)-sebacate (DBES).

More preferably, the plasticizers having boiling point (hereinafter represented as b.p.) higher than triethylenglycol-di-(2-ethylhexanoate) (3GO, b p.; 344° C.) are used. Examples of such plasticizers include such as tetraethylene glycol-di-(2-ethylhexanoate) (b.p.; 499° C.), oligoethylene glycol-di-(2-ethylhexanoate), di-(2-butoxyethyl)-adipate (b.p.; 230-240° C./0.27 kPa), di-(2-butoxyethoxyethyl)-sebacate (DBEES, b.p.≥240° C./0.27 kPa) and cyclohexane dicarboxylic acid diisononyl ester (b.p.; 270° C./2 kPa). These plasticizers may be used alone, or two or more of them may be used in combination.

It is necessary that the content of the plasticizer is 15 to 60 parts by mass based on 100 parts by mass of the polyvinyl acetal resin. The content is more preferably 20 to 40 parts by mass. When the content of the plasticizer is more than 60 parts by mass, handling is poor due to adhesiveness and the film strength is decreased. On the other hand, when the content of the plasticizer is less than 15 parts by mass, low temperature penetration resistance is likely to be decreased.

Plasticized Polyvinyl Acetal Film

In an embodiment of the present invention, it is necessary that the plasticized polyvinyl acetal film has an acid value of 5.0 meq/kg or less. The plasticized polyvinyl acetal film has an acid value of preferably 3.0 meq/kg or less, more preferably 2.0 meq/kg or less, and further preferably 1.5 meq/kg or less. An acid value of more than 5.0 meq/kg causes corrosion of module production equipment and metal components of the resulting solar cell and functional laminated glass. To set the acid value of the plasticized polyvinyl acetal film at 5.0 meq/kg or less, there is a method in which a low acid value polyvinyl acetal resin and plasticizer, which are mixed after being sufficiently dried, are melt-kneaded at the lowest temperature possible. In another embodiment of the present invention, it is necessary that the plasticized polyvinyl acetal film has an acid value after heating at 140° C. for 4 hours of 10.0 meq/kg or less. The plasticized polyvinyl acetal film has an acid value after heating at 140° C. for 4 hours of preferably 8.0 meq/kg or less, more preferably 7.0 meq/kg or less. Here, the acid value is measured in accordance with the method of JIS K6728:1977. To set the acid value of the plasticized polyvinyl acetal film after heating at 140° C. for 4 hours at 10.0 meq/kg or less, it is preferable to use a low acid value polyvinyl acetal resin and plasticizer. Herein, a polyvinyl acetal resin which is porous and has excellent plasticizer absorption, and a plasticizer having a total number of 28 or more of carbon atoms and oxygen atoms constituting a molecule are preferred. These raw materials are mixed after being sufficiently dried and melt-kneaded at the lowest temperature possible. In addition, preferably the materials are moderately neutralized, and more specifically, preferably the alkali titer value is adjusted to the value described above.

Figure 4:
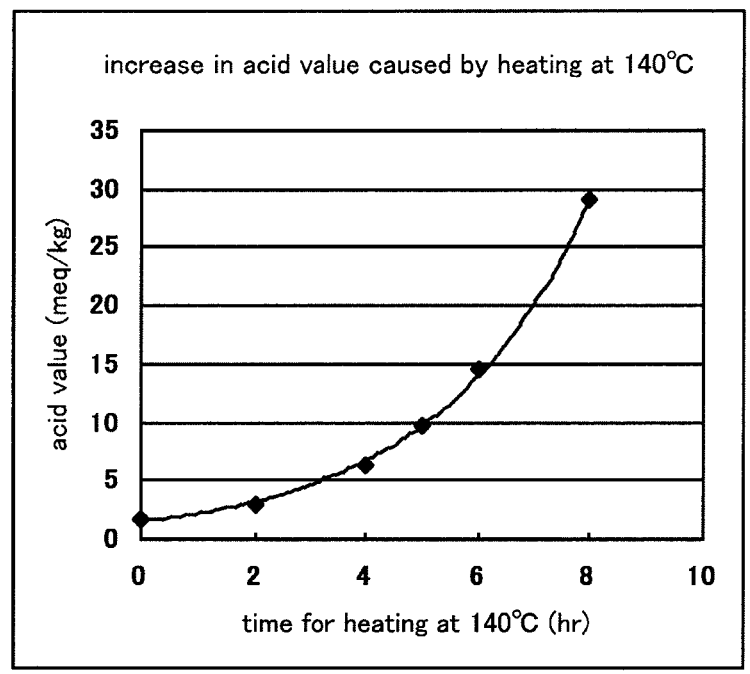
FIG. 4 is a graph showing an increase in acid values when the film of Example 7 was heated at 140° C.

As an example, FIG. 4 shows an increase in the acid value when heating at 140° C. using the film of Example 7. As FIG. 4 shows, the acid value increases exponentially. Meanwhile, to increase the lamination speed, heating temperature needs to be higher, and when a plasticized polyvinyl acetal film having an acid value of more than 5.0 meq/kg is used, the acid value of the film rapidly increases. Acid components cause corrosion of solar cells, transparent electrodes and metal electrodes in a laminated glass provided with a solar cell or a functional unit, which is produced by using such plasticized polyvinyl acetal film, and the duration of their function is likely to be short.

The plasticized polyvinyl acetal film of the present invention contains, preferably 50 ppm or less, more preferably 25 ppm or less, of chloride ions, sulfate ions, and nitrate ions. When the content of these strong acid ions exceeds 50 ppm, the film is likely to be colored and metal components used for solar cell modules are likely to be corroded.

The plasticized polyvinyl acetal film of the present invention has a thickness of preferably 0.38 to 2.28 mm, which is not particularly limited thereto. When the film is thinner than 0.38 mm, it is likely that the film fails to adequately seal the space around solar cells and functional units. On the other hand, when the film is thicker than 2.28 mm, it is likely that the cost of the film is increased and the cycle time in the lamination step is extended.

The plasticized polyvinyl acetal film of the present invention has a melt flow rate measured at a load of 21.6 kg at 150° C. (a 2 mm nozzle) of preferably 15 to 40 g/10 minutes, and more preferably 20 to 35 g/10 minutes. When the film has a melt flow rate of less than 15 g/10 minutes, it is likely that due to its extremely low flowability, the time for lamination is longer when producing a laminated glass or a solar cell module, or bubbles remain in the laminated glass. On the other hand, when the film has a melt flow rate of more than 40 g/10 minutes, it is likely that when a laminated glass or a solar cell module is broken by external force, sufficient film strength for preventing an article from penetrating cannot be exerted, or the resin overflows from the edge at the time of lamination, contaminating laminators. Using the plasticized polyvinyl acetal film having the above melt flow rate enables sufficient sealing of spaces between solar cells, functional units and wiring of them in the lamination step, forms no bubble or seam and offers a product without any optical problems.

The plasticized polyvinyl acetal film of the present invention has a total amount of aldehyde trimers and organic volatile components having a boiling point lower than that of the aldehyde trimer contained in the film after heating at 120° C. for 30 minutes in head-space gas chromatography of preferably 500 ppm or less, more preferably 300 ppm or less, further preferably 200 ppm or less, particularly preferably 100 ppm or less, and most preferably 50 ppm or less. In particular, the total amount of aldehyde monomers, dimers and trimers which form carboxylic acid by oxidation is preferably 300 ppm or less, more preferably 200 ppm or less, further preferably 150 ppm or less, particularly preferably 100 ppm or less, and most preferably 50 ppm or less.

The plasticized polyvinyl acetal films according to the present invention can further contain the additives such as antioxidants, ultraviolet absorbers, adhesion control agents, antiblocking agents, pigments, dye compounds, functional inorganic compounds and the like, when needed, as long as the objects of the present invention are not impaired.

Examples of the antioxidants used include phenol antioxidants, phosphorous antioxidants, sulfur antioxidants and the like, and among these, preferred is phenol antioxidants, and alkyl substituted phenol antioxidants is particularly preferred.

Examples of phenol antioxidants include: acrylate compounds such as 2-t-butyl-6-(3-t-butyl-2-hydroxy-5-methylbenzyl)-4-methylphenylacrylate, 2,4-di-t-amyl-6-[1-(3,5-di-t-amyl-2-hydroxyphenyl)ethyl]phenylacrylate; alkyl substituted phenol compounds such as 2,6-di-t-butyl-4- methylphenol, 2,6-di-t-butyl-4-ethylphenol, octadecyl-3-(3,5-di-t-butyl-4-hydroxyphenyl)propionate, 2,2'-methylene-bis(4-methyl-6-t-butylphenol), 4,4'-butylidene-bis(4-methyl-6-t-butylphenol), 4,4'-butylidene-bis(6-t-butyl-m-cresol), 4,4'-thiobis(3-methyl-6-t-butylphenol), bis(3-cyclohexyl-2-hydroxy-5-methylphenyl)methane, 3,9-bis{2-[3-(3-t-butyl-4-hydroxy-5-methylphenyl)propionyloxy]-1,1-dimethylethyl}-2,4,8,10-tetraoxaspiro[5,5]undecane, 1,1,3-tris(2-m ethyl-4-hydroxy-5-t-butylphenyl)butane, 1,3,5-trim ethyl-2,4,6-tris(3,5-di-t-butyl-4-hydroxybenzyl) benzene, tetrakis[methylene-3-(3',5'-di-t-butyl-4'-hydroxyphenyl)propionate]methane, triethylene glycol bis [3-(3-t-butyl-4-hydroxy-5-methylphenyl)propionate]; triazine group containing phenol compounds such as 6-(4-hydroxy-3,5-di-t-butylanilino)-2,4-bis-octylthio-1,3,5-triazine, 6-(4-hydroxy-3,5-dimethylanilino)-2,4-bis-octylthio-1,3,5-triazine, 6-(4-hydroxy-3-methyl-5-t-butylanilino)-2,4-bis-octylthio-1,3,5-triazine, 2-octylthio-4,6-bis-(3,5-di-t-butyl-4-oxyanilino)-1,3,5-triazine.

Examples of phosphorous antioxidants include, for example, monophosfite compounds such as triphenyl phosphite, diphenyl isodecyl phosphite, phenyl diisodecyl phosphite, tris(nonylphenyl)phosphite, tris(dinonylphenyl)phosphite, tris(2-t-butyl-4-methylphenyl)phosphite, tris(cyclohexylphenyl)phosphite, 2,2-methylenebis(4,6-di-t-butylphenyl)octyl phosphite, 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, 10-decyloxy-9,10-dihydro-9-oxa-10-phosphaphenanthrene; diphosfite compounds such as 4,4'-butylidene-bis(3-methyl-6-t-butylphenyl-di-tridecyl-phospite), 4,4'-isopropylidene-bis(phenyl-di-alkyl phoshite) (alkyl=C12-C15), 4,4'-isopropylidene-bis(diphenyl monoalkyl phoshite)(alkyl=C12-C15), 1,1,3-tris(2-methyl-4-di-tridecylphosphite-5-t-butylphenyl)butane, tetrakis(2,4-di-t-butylphenyl)-4,4'-biphenylenephosphite, and the like. Among them, mono phosphite compounds are preferred.

Examples of sulfur antioxidants include such as dilauryl-3,3'-thiodipropionate, distearyl-3,3'-thiodipropionate, laurylstearyl-3,3'-thiodipropionate, pentaerythritol-tetrakis-(β-laury-thiodipropionate) and 3,9-bis(2-dodecylthioethyl)-2,4,8,10-tetraoxaspiro[5,5]undecane.

These antioxidants may be used alone or in a combination of two or more. The amount of the antioxidant added ranges from 0.001 to 5 parts by mass, preferably from 0.01 to 1 part by mass, based on 100 parts by mass of the polyvinyl acetal resin.

The time to add these antioxidants is not particularly limited, and it is preferable that part of all antioxidant is previously added to the polyvinyl acetal resin and the plasticizer. For example, to obtain the plasticized polyvinyl acetal film of the present invention, it is more preferable to add an antioxidant even when producing the raw material polyvinyl acetal resin. Further, it is preferable that the antioxidant is also added to the raw material plasticizer.

Examples of the ultraviolet absorbers include: triazole ultraviolet absorbers such as 2-(5-methyl-2-hydroxyphenyl) benzotriazole, 2-[2-hydroxy-3,5-bis(α,α'-dimethylbenzyl) phenyl]-2H-benzotriazole, 2-(3,5-di-t-butyl-2-hydroxyphenyl)benzotriazole, 2-(3-t-butyl-5-methyl-2-hydroxyphenyl)-5-chlorobenzotriazole, 2-(3,5-di-t-butyl-5-methyl-2-hydroxyphenyl)-5-chlorobenzotriazole, 2-(3,5-di-t-amyl-2-hydroxyphenyl)benzotriazole and 2-(2'-hydroxy-5'-t-octylphenyl)benzotriazole; hindered amine ultraviolet absorbers such as 2,2,6,6-tetramethyl-4-piperidylbenzoate, bis(2,2,6,6-tetramethyl-4-piperidyl)sebacate, bis(1,2,2,6,6-pentamethyl-4-piperidyl)-2-(3,5-di-t-butyl-4-hydroxyben-zyl)-2-n-butylmalonate and 4-[3-(3,5-di-t-butyl-4-hydroxyphenyl)propionyloxy]-1-{2-[3-(3,5-di-t-butyl-4-hydroxyphenyl)propionyloxy]ethyl}-2,2,6,6-tetramethylpiperidine; benzoate ultraviolet absorbers such as 2,4-di-t-butylphenyl-3,5-di-t-butyl-4-hydroxybenzoate and hexadecyl-3,5-di-t-butyl-4-hydroxybenzoate. The ultraviolet absorber is added preferably from 10 to 50000 ppm based on the weight of the polyvinyl acetal resin, and more preferably from 100 to 10000 ppm. Moreover, two or more of these ultraviolet absorbers may be used in combination.

As the adhesive adjusting agent to be used, those described in WO03/033583A1 may be used. Alkaline metal salts and/or alkaline earth metal of organic acid are preferred, and potassium acetate and/or magnesium acetate are more preferred. The amount added is preferably 1 to 10,000 ppm, more preferably 5 to 1,000 ppm, and further preferably 10 to 300 ppm based on 100 parts by mass of a polyvinyl acetal resin on a mass basis. The optimal amount of the adhesive adjusting agent varies depending on additives used or locations where the resulting solar cell module or laminated glass is used. It is preferable that the adhesive strength of the resulting film to glass is adjusted to generally 3 to 10 in Pummel Test described in WO03/033583A1 etc. It is preferable that when particularly high penetration resistance is required, the adhesive strength is adjusted to 3 to 6, and when high shatterproof properties are required, the adhesive strength is adjusted to 7 to 10. When high shatterproof properties are required, not adding an adhesive adjusting agent is also useful.

Examples of functional inorganic compounds include light reflective materials, light absorbing materials, heat conductivity improving materials, electric property improving materials, gas barrier property improving materials, and mechanical property improving materials.

The method of adding such additives for producing a film is not particularly limited, and known methods are used. Methods for producing a film using an extruder are preferably used. The resin temperature at the time of extrusion is preferably 150 to 220° C., and more preferably 180 to 220° C. When the resin temperature exceeds 220° C., it is likely that the polyvinyl acetal resin is decomposed and the content of volatile substances is increased. On the other hand, when the resin temperature is less than 150° C., the content of volatile substances is also likely to be increased. To remove volatile substances efficiently, preferably the volatile substances are removed through the vent port of the extruder by reducing pressure.

It is preferable that irregularities are formed on the surface of the plasticized polyvinyl acetal film of the present invention in order to improve deaeration properties in the lamination step. Known methods may be used as the method of forming irregularities, and examples thereof include a method of forming a melt fracture state by adjusting extrusion conditions and a method of forming an emboss structure on the extruded film.

The solar cell module of the present invention is produced by a known method, using the plasticized polyvinyl acetal film of the present invention as a sealing material.

Types of solar cells used for the solar cell module of the present invention are not particularly limited, and examples thereof include crystal cells and thin film cells. Examples of crystal cells include monocrystalline silicon and polycrystalline silicon. Examples of thin film cells include amorphous silicon, thin film silicon types such as a laminate of amorphous silicon and polycrystalline thin film, compound semiconductor types using CIS, GIGS, CdTe or GaAs, and organic solar cell types.

In the case of crystal cells, the plasticized polyvinyl acetal film of the present invention is inserted, as a sealing material, between a surface transparent substrate such as glass and a crystal cell, and/or between a crystal cell and a rear side glass or a back sheet, and they are laminated to produce the solar cell module of the present invention. In the case of so-called superstrate types of thin film types, the plasticized polyvinyl acetal film of the present invention is inserted, as a sealing material, between a surface transparent substrate on which a solar cell is placed and a rear side glass or a back sheet. In the case of substrate types, the plasticized polyvinyl acetal film of the present invention is inserted between a surface transparent substrate and a substrate on which a solar cell is placed as a sealing material. Further, for these laminates, the plasticized polyvinyl acetal film of the present invention may be used as an adhesive layer for a transparent substrate, back sheet and other reinforcing substrates.

The glass used for the solar cell module of the present invention is not particularly limited, and glass provided with a transparent conductive film layer is preferred because the present invention is more effective for them. The transparent conductive film layer may contain ITO (indium-doped tin oxide), ATO (antimony-doped tin oxide), FTO (fluorine-doped tin oxide), tin oxide ($SnO_2$) or zinc oxide (ZnO). The layer may be prepared by using various known film forming processes.

The solar cell module of the present invention may have a known solar cell module structure as long as the plasticized polyvinyl acetal film of the present invention is used as all or part of the above-described sealing material.

The back sheet to be used is not particularly limited, and those having excellent weatherability and low water permeability are preferably used. Polyester film, fluorine resin film, laminates thereof, and those laminated with an inorganic compound may be used.

After being formed into a laminated body with the plasticized polyvinyl acetal film, the back sheet to be used has a peeling strength in a peeling test at 180° C. of preferably 5 N/cm or more, more preferably 7 N/cm or more, and further preferably 10 N/cm or more.

The laminated glass of the present invention is prepared by inserting and laminating the plasticized polyvinyl acetal film of the present invention between two or more pieces of glass. A laminated glass provided with a functional unit at a position in contact with the plasticized polyvinyl acetal film is particularly useful.

Examples of functional units include heat sensors, optical sensors, pressure sensors, thin film electrostatic capacitance sensors, liquid crystal display film, electrochromic functional film, electroluminescence functional film, light emitting diodes, cameras, IC tags, antennas and electrodes and wiring for connecting them.

The glass to be used is not particularly limited, and float glass, reinforced glass, wire mesh glass and organic glass may be used. The thickness of the glass is not particularly limited, and the glass has a thickness of preferably 1 to 10 mm, and more preferably 2 to 6 mm.

Also the solar cell module and the laminated glass of the present invention may be combined with known frames, junction boxes, sealing agents, attaching jigs and frames, anti-reflection film, various types of equipment using solar heat, rain gutter structures and the like.

For the method of lamination for preparing the solar cell module and the laminated glass, a known method may be used. Examples thereof include methods using a vacuum laminator, methods using a vacuum bag, methods using a vacuum ring and methods using a nip roll. In addition, a method comprising introducing into an autoclave step after temporarily press-fitting may be used.

Of them, the method using a vacuum laminator is particularly effective. For example, lamination is performed using a known laminator for producing solar cells under a reduced pressure of 1 to 30,000 Pa at 100 to 200° C., and preferably 130 to 160° C. The method using a vacuum bag or a vacuum ring is described, for example, in EP1235683B1, in which lamination is performed at a pressure of about 20,000 Pa at 130 to 145° C.

In the production of a laminated glass or a solar cell module using the plasticized polyvinyl acetal film of the present invention, lamination can be performed at higher temperatures at higher lamination speed as compared to the case using di-n-hexyl adipate (DHA) as a plasticizer.

The solar cell module and the laminated glass of the present invention may be used as a member for windows, walls, roofs, sunrooms, soundproof walls, shop windows, balconies and handrail walls, or as a partition glass member for conference rooms etc. The solar cell module and the laminated glass may also be used for household electric appliances.

EXAMPLES

Hereinafter the present invention will be described in detail by way of Examples, but the present invention is not limited to the following Examples. In Examples below, "%" and "part(s)" refer to "% by mass" and "part(s) by mass" unless otherwise specified.

Physical properties of the polyvinyl butyral (PVB) resins prepared in these Examples were measured in accordance with the following methods.

Content of Vinyl Acetate Unit in PVB Resin
Measured in accordance with the method of JIS K6728: 1977.

Content of Vinyl Alcohol Unit in PVB Resin
Measured in accordance with the method of JIS K6728: 1977.

Alkali Titer Value of PVB Resin
An ethanol solution of PVB resin was titrated with hydrochloric acid, and the alkali titer value was determined based on the amount of 0.01 mole/L hydrochloric acid necessary for the titration of alkali in 100 g of the PVB resin (alkali titer value: mL).

Measurement of Acid Value of PVB Resin and Film
Measured in accordance with the method of JIS K6728: 1977. For the film, the acid value after heating in a test tube at 140° C. for 4 hours was also measured.

Content of Volatile Components in PVB Resin
The content of volatile components was measured using head-space gas chromatography GC-14B available from Shimadzu Corporation and column TC-1 (inner diameter 0.25 mm, length 30 m) available from GL Sciences Inc.

Measurement of Chloride Ion Content in PVB Resin and Film
10 ml of distilled water and 80 ml of ethanol were added to 1 ml of an aqueous 3% nitric acid solution, and about 1 g of a PVB film sample was precisely weighed and added thereto. The mixture was stirred to dissolve the sample, and then an aqueous 0.001 mole/L silver nitrate solution was added thereto dropwise. The chloride ion concentration in the film was calculated from the titer determined by the change in the electrical conductivity. In Examples and Comparative Examples described later, only hydrochloric acid is used as an acetalization catalyst for preparing PVB resin, and therefore the chloride ion content in the PVB resin and that in the PVB film correspond to the total content of chloride ions, sulfate ions, and nitrate ions contained in the PVB resin and that in the PVB film, respectively.

Shape of Particles of PVB Resin

The shape of particles of the PVB resin was observed by a scanning electron microscope (SEM). Also, for the average particle size of primary particles of the PVB resin, a photograph of the resin was taken at three sites (three photographs) at a magnification of 1000 times using the scanning electron microscope (SEM), and the particle size of distinguishable primary particles in the photos (50 particles or more for each photo) was measured, and the average value was calculated to be the average particle size. The particle size of primary particles was measured with the major axis.

Preparation Example 1

A 2 m³ reactor equipped with a stirrer was charged with 1700 kg of a 7.5% by mass aqueous solution of PVA (PVA-1: polymerization degree 1700, saponification degree 99% by mole), 74.6 kg of n-butyl aldehyde and 0.13 kg of 2,6-di-t-butyl-4-methylphenol, and the whole reactor was cooled to 14° C. 160.1 L of hydrochloric acid at a concentration of 20% by mass was added thereto to initialize butyralization of PVA. Heating was started 10 minutes after completion of the addition, and the temperature was raised to 65° C. over 90 minutes, and the reaction was continued for another 120 minutes. Then the reactor was cooled to room temperature and the precipitated resin was filtered and washed with 10 times its volume of ion exchange water for 10 times. Subsequently, the resultant was sufficiently neutralized using a 0.3% by mass aqueous sodium hydroxide solution, washed with 10 times the resin's volume of ion exchange water for 10 times, dehydrated and dried to give a PVB resin (PVB-1). As FIG. 1 shows, the observation by SEM shows that small primary particles formed aggregates with maintaining their substantial shape. The results of analysis of the resulting PVB resin are shown in Table 1.

Preparation Example 2

A PVB resin (PVB-2) was prepared in the same manner as in Preparation Example 1 except for using a 0.5% by mass aqueous sodium hydroxide solution for neutralization. The results of analysis of the resulting PVB resin are shown in Table 1.

Preparation Example 3

Figure 2:
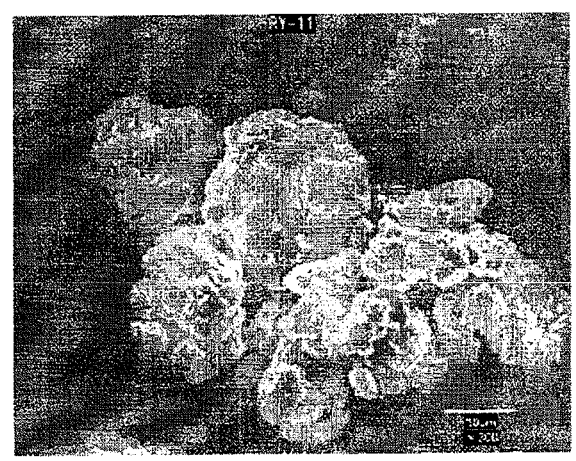
FIG. 2 is an SEM image of PVB-3 prepared in Preparation Example 3.

A 2 m³ reactor equipped with a stirrer was charged with 1700 kg of a 9.0% by mass aqueous solution of PVA-1 and 120.1 L of hydrochloric acid at a concentration of 20%, and the whole reactor was cooled to 14° C. 89.5 kg of n-butyl aldehyde and 0.13 kg of 2,6-di-t-butyl-4-methylphenol were added thereto to initialize butyralization of PVA. Heating was started 10 minutes after completion of the addition, and the temperature was raised to 65° C. over 90 minutes, and the reaction was continued for another 120 minutes. Then the reactor was cooled to room temperature and the precipitated resin was filtered and washed with 10 times its volume of ion exchange water for 10 times. Subsequently, the resultant was sufficiently neutralized using a 0.3% by mass aqueous sodium hydroxide solution, washed with 10 times the resin's volume of ion exchange water for 10 times, dehydrated and dried to give a PVB resin (PVA-3). As FIG. 2 shows, the observation by SEM shows that primary particles were fused and formed aggregates in which the shape of the primary particles was indistinct. The results of analysis of the resulting PVB resin are shown in Table 1.

TABLE 1

| PVB | Vinyl acetate unit (mol %) | Vinyl alcohol unit (mol %) | Shape of primary particle (average particle size) | Alkali titer | Acid value of resin (meq/kg) | Chloride ion content (ppm) | Volatile component (ppm) |
| --- | --- | --- | --- | --- | --- | --- | --- |
| PVB-1 | 0.9 | 28.5 | Small and clear (3.2 μm) | 7 | 0.5 | 18 | 160 |
| PVB-2 | 0.9 | 28.5 | Small and clear (3.6 μm) | 14 | 0.9 | 34 | 200 |
| PVB-3 | 0.9 | 28.0 | Particles fused and primary particles indistinct | 5 | 3.2 | 94 | 710 |

Example 1

To 1 kg of the PVB resin (PVB-1) prepared in Preparation Example 1 were added 1.0 g of paramethoxyphenol and 360 g of oligoethylene glycol di(2-ethyl hexanoate)(average ethylene glycol chain length: 9) (9GO; acid value 0.4 meq/kg). Using a small twin screw extruder, a PVB film (F-1) having a thickness of 760 μm and a width of 50 cm was produced. In the production, two vent ports of the extruder were connected to a vacuum pump to remove volatile components by reducing pressure, and the resin temperature was adjusted to 200° C. The results of analysis are shown in Table 2.

Example 2

A PVB film (F-2) was produced in the same manner as in Example 1 except for using 360 g of di(2-butoxyethoxyethyl) sebacate (DBEES; acid value 0.7 meq/kg) as a plasticizer. The results of analysis are shown in Table 2.

Example 3

A PVB film (F-3) was produced in the same manner as in Example 2 except for using the PVB resin (PVB-2) prepared in Preparation Example 2. The results of analysis are shown in Table 2. The film was slightly brown as compared to F-1 and F-2.

Comparative Example 1

A PVB film (F-4) was produced in the same manner as in Example 2 except for using the PVB resin (PVB-3) prepared in Preparation Example 3. The results of analysis are shown in Table 2.

Comparative Example 2

A PVB film (F-5) was produced in the same manner as in Example 1 except for using di-n-hexyl adipate (DHA; acid value 0.8 meq/kg) as a plasticizer. The results of analysis are shown in Table 2.

YI Value of Laminated Glass

The PVB film produced in the above Examples 1 to 3 and Comparative Examples 1 and 2 was each put between two pieces of 3-mm thick float glass and a laminated glass was prepared by a vacuum bag process. The yellowness index (YI) of the laminated glass was measured using a color difference meter (SM-T made by Suga Test Instruments Co., Ltd.)

ing the pressure of the upper chamber to ordinary pressure. Part of the PVB film was collected from the laminated glass prepared at a lamination temperature of 160° C., and the acid value was measured in accordance with the method of JIS K6728:1977. Also, the highest temperature of the lamination temperatures at which no bubbles or contamination occurred in the laminated glass was defined as the highest lamination temperature; the highest lamination temperature was 170° C. in Example 4 and the highest lamination temperature was 160° C. in Examples 5 and 6. The results are shown in Table 3.

Comparative Example 3

Laminated glass samples were prepared and evaluated in the same manner as in Example 4 except for using the PVB

TABLE 2

| | Resin | Acid value of resin (meq/kg) | Plasticizer | Acid value of plasticizer (meq/kg) | Film | Acid value of film (meq/kg) | Acid value of film after heating* (meq/kg) | Chloride ion content (ppm) | YI value of laminated glass |
|---|---|---|---|---|---|---|---|---|---|
| Example 1 | PVB-1 | 0.5 | 9GO | 0.4 | F-1 | 1.5 | 4.4 | 13 | 0.2 |
| Example 2 | PVB-1 | 0.5 | DBEES | 0.7 | F-2 | 1.8 | 7.1 | 13 | 0.3 |
| Example 3 | PVB-2 | 0.9 | DBEES | 0.7 | F-3 | 2.5 | 9.2 | 25 | 0.6 |
| Comparative Example 1 | PVB-3 | 3.2 | DBEES | 0.7 | F-4 | 8.8 | 14.3 | 69 | 1.3 |
| Comparative Example 2 | PVB-1 | 0.5 | DHA | 0.8 | F-5 | 3.5 | 12.8 | 16 | 1.5 |

9GO: $C_7H_{15}$—COO—$(C_2H_4$—O$)_n$—CO—$C_7H_{15}$, average value of n = 9, C + O = 46
DBEES: $C_4H_9$—O—$C_2H_4$—O—$C_2H_4$—O—CO—$C_8H_{16}$—COO—$C_2H_4$—O—$C_2H_4$—O—$C_4H_9$, C + O = 34
DHA: $C_6H_{13}$—O—CO—$C_4H_8$—COO—$C_6H_{13}$, C + O = 22
*Acid value after heating at 140° C. for 4 hours

Examples 4 to 6

Using a vacuum laminator used for producing solar cell modules (made by NPC Incorporated), a laminated glass sample was prepared using two pieces of 3-mm thick 50 cm by 50 cm glass and a PVB film (F-1, F-2 and F-3) whose moisture content was previously adjusted to 0.45% by mass. In the experiment, first the set temperature of the laminator was adjusted to 150° C. and glass/PVB film/glass overlapped in that order were laminated, and the surface of the resulting laminated glass was visually observed. Next, with increasing the set temperature of the laminator in 5° C. increments from 150° C., preparation of another laminated glass and visual observation of the surface was repeated at each set temperature until a temperature was reached at which contamination by volatile components occurred on the surface of the laminated glass. A laminated glass was prepared using each of the PVB film F-1, F-2 and F-3 at each set temperature, and so the experiment was performed three times each. Other lamination conditions included a reduced pressure of 100 Pa, a time for reducing pressure of 10 minutes and press fitting for another 10 minutes with restorfilm (F-4). The highest lamination temperature was 150° C. in Comparative Example 3. The results are shown in Table 3.

Comparative Example 4

Laminated glass samples were prepared and evaluated in the same manner as in Example 4 except for using the PVB film (F-5) and increasing the set temperature in the experiment in 5° C. increments from 140° C. The highest lamination temperature was 140° C. in Comparative Example 4. The results are shown in Table 3.

Appearance at the Time of Lamination

The appearance of the laminated glasses prepared in Examples 4 to 6 and Comparative Examples 3 and 4 at each lamination temperature was visually rated as follows. The results are shown in Table 3.

Rated: Based on

A: No bubbles found in the laminated glass or no contamination by volatile components on the laminated glass surface.

B: Bubbles found in the laminated glass.

C: The surface of the laminated glass contaminated by volatile components.

TABLE 3

| | Resin | Film | Lamination temperature (° C.) | | | | | | | | | | Highest lamination temperature (° C.) | Acid value of film in 160° C. lamination (meq/kg) |
| | | | 140 | 145 | 150 | 155 | 160 | 165 | 170 | 175 | 180 | 185 | | |
|---|---|---|---|---|---|---|---|---|---|---|---|---|---|---|
| Example 4 | PVB-1 | F-1 | — | — | A | A | A | A | A | B | B | C | 170 | 1.8 |
| Example 5 | PVB-1 | F-2 | — | — | A | A | A | B | C | — | — | — | 160 | 2.1 |
| Example 6 | PVB-1 | F-3 | — | — | A | A | A | B | C | — | — | — | 160 | 3.2 |
| Comparative Example 3 | PVB-3 | F-4 | — | — | A | B | B | B | C | — | — | — | 150 | 15.1 |
| Comparative Example 4 | PVB-1 | F-5 | A | B | C | — | — | — | — | — | — | — | 140 | N/A |

A: No bubbles found in laminated glass or no contamination by volatile components on laminated glass surface.
B: Bubbles found in laminated glass.
C: Surface of laminated glass contaminated by volatile components
—: Not tested Preparation Example 4

Figure 3:
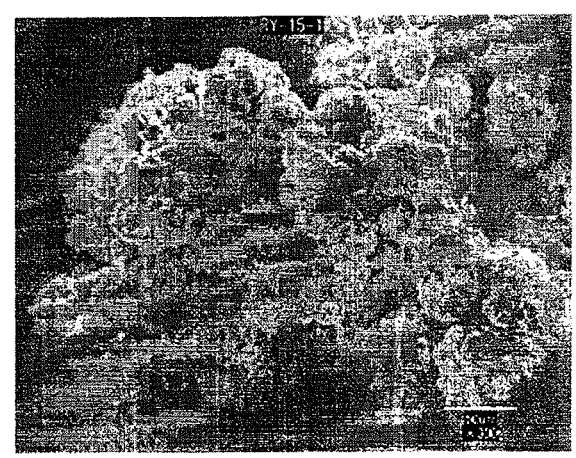
FIG. 3 is an SEM image of PVB-4 prepared in Preparation Example 4.

A 2 m³ reactor equipped with a stirrer was charged with 1700 kg of a 7.5% by mass aqueous solution of PVA-1 and 106.7 L of hydrochloric acid at a concentration of 20%, and the whole reactor was cooled to 14° C. 74.6 kg of n-butyl aldehyde and 0.13 kg of 2,6-di-t-butyl-4-methylphenol were added thereto to initialize butyralization of PVA. Heating was started 10 minutes after completion of the addition, and the temperature was raised to 65° C. over 90 minutes, and the reaction was continued for another 120 minutes. Then the reactor was cooled to room temperature and the precipitated resin was filtered and washed with 10 times its volume of ion exchange water for 5 times. Subsequently, the resultant was sufficiently neutralized using a 0.3% by mass aqueous sodium hydroxide solution, washed with 10 times the resin's volume of ion exchange water for 10 times, dehydrated and dried to give a PVB resin (PVB-4). As FIG. 3 shows, the observation by SEM shows that primary particles slightly larger than those of PVB-1 formed aggregates with maintaining their substantial shape. The results of analysis of the resulting PVB resin are shown in Table 4.

Preparation Example 5

A PVB resin (PVB-5) was prepared in the same manner as in Preparation Example 3 except for not adding 2,6-di-t-butyl-4-methylphenol. The results of analysis of the resulting PVB resin are shown in Table 4.

Preparation Example 6

A PVB resin (PVB-6) was prepared in the same manner as in Preparation Example 1 except that the amount charged of butyl aldehyde was 69.9 kg. The results of analysis of the resulting PVB resin are shown in Table 4.

TABLE 4

| PVB | Vinyl acetate unit (mol %) | Vinyl alcohol unit (mol %) | Shape of primary particle (average particle size) | Alkali titer | Acid value of resin (meq/kg) | Chloride ion content (ppm) | Volatile component (ppm) |
|---|---|---|---|---|---|---|---|
| PVB-4 | 0.9 | 28.1 | Particle size slightly large and clear | 7 | 2.3 | 46 | 580 |
| PVB-5 | 0.9 | 28.0 | Particles fused and primary particles indistinct | 5 | 5.2 | 83 | 770 |
| PVB-6 | 0.9 | 32.5 | Small and clear | 8 | 0.8 | 32 | 180 |

Example 7

A PVB film (F-6) was produced in the same manner as in Example 1 except for using 360 g of triethylene glycol di(2-ethyl hexanoate) (3GO; acid value 0.5 meq/kg) as a plasticizer. The results of analysis are shown in Table 5.

Example 8

A PVB film (F-7) was produced in the same manner as in Example 1 except for using the PVB resin (PVB-4) prepared in Preparation Example 4 and di(2-butoxyethoxyethyl) adipate (DBEEA; acid value 0.3 meq/kg) as a plasticizer. The results of analysis are shown in Table 5.

Comparative Example 5

A PVB film (F-8) was produced in the same manner as in Example 7 except for using 3GO (acid value 3.9 meq/kg) containing many acid impurities derived from raw material as a plasticizer. The results of analysis are shown in Table 5.

Comparative Example 6

A PVB film (F-9) was produced in the same manner as in Example 7 except for adjusting the temperature of the extruder so that the resin temperature was 230° C. The results of analysis are shown in Table 5.

Comparative Example 7

A PVB film (F-10) was produced in the same manner as in Example 7 except for closing one of the two vent ports provided on the extruder. The results of analysis are shown in Table 5.

Comparative Example 8

A PVB film (F-11) was produced in the same manner as in Example 7 except for using the PVB resin (PVB-5) prepared in Preparation Example 5. The results of analysis are shown in Table 5.

Comparative Example 9

A PVB film (F-12) was produced in the same manner as in Example 1 except for using the PVB resin (PVB-6) prepared in Preparation Example 6 and dibutyl adipate (DBA; acid value 0.4 meq/kg) as a plasticizer. The results of analysis are shown in Table 5.

YI Value of Laminated Glass

The PVB film prepared in Examples 7 and 8 and Comparative Examples 5 to 9 was each put between two pieces of 3-mm thick float glass and a laminated glass was prepared by a vacuum bag process. The yellowness index (YI) of the laminated glass was measured using a color difference meter (SM-T made by Suga Test Instruments Co., Ltd.).

Example 10

The retention rate of power generation efficiency before and after the damp heat test was calculated in the same manner as in Example 9 except for using the film F-2 prepared in Example 2 instead of the film F-1. The solar cell module had a retention rate of power generation efficiency of 97%.

Example 11

The retention rate of power generation efficiency before and after the damp heat test was calculated in the same manner as in Example 9 except for using the film F-6 prepared in Example 7 instead of the film F-1. The solar cell module had a retention rate of power generation efficiency of 95%.

Comparative Example 10

The retention rate of power generation efficiency before and after the damp heat test was calculated in the same manner as in Example 9 except for using the film F-8 prepared in Comparative Example 5 instead of the film F-1. The solar cell module had a retention rate of power generation efficiency of 92%.

TABLE 5

| | Resin | Acid value of resin (meq/kg) | Plasticizer | Acid value of plasticizer (meq/kg) | Film | Acid value of film (meq/kg) | Acid value of film after heating* (meq/kg) | Chloride ion content (ppm) | YI value of laminated glass |
|---|---|---|---|---|---|---|---|---|---|
| Example 7 | PVB-1 | 0.5 | 3GO | 0.5 | F-6 | 1.6 | 6.4 | 13 | 0.3 |
| Example 8 | PVB-4 | 2.3 | DBEEA | 0.3 | F-7 | 3.8 | 9.7 | 32 | 0.8 |
| Comparative Example 5 | PVB-1 | 0.5 | 3GO | 3.9 | F-8 | 10.7 | 16.0 | 15 | 2.2 |
| Comparative Example 6 | PVB-1 | 0.5 | 3GO | 0.5 | F-9 | 6.6 | 13.1 | 14 | 1.8 |
| Comparative Example 7 | PVB-1 | 0.5 | 3GO | 0.5 | F-10 | 9.2 | 14.9 | 16 | 1.9 |
| Comparative Example 8 | PVB-5 | 5.2 | 3GO | 0.5 | F-11 | 12.1 | 17.3 | 57 | 2.5 |
| Comparative Example 9 | PVB-6 | 0.5 | DBA | 0.4 | F-12 | 3.6 | 10.5 | 24 | 1.1 |

3GO: $C_7H_{15}$—COO—$(C_2H_4$—O$)_3$—CO—$C_7H_{15}$, C + O = 28
DBEEA: $C_4H_9$—O—$C_2H_4$—O—$C_2H_4$—O—CO—$C_4H_8$—COO—$C_2H_4$—O—$C_2H_4$—O—$C_4H_9$, C + O = 30
DBA: $C_4H_{13}$—O—CO—$C_4H_8$—COO—$C_4H_{13}$, C + O = 18
*Acid value after heating at 140° C. for 4 hours

Example 9

The film F-1 prepared in Example 1 (30 cm by 30 cm) was put between a 3-mm thick 30 cm by 30 cm float glass provided with an a-Si solar cell with a bus bar electrode and another piece of glass having the same thickness and dimension, and they were sealed using a vacuum laminator. A junction box was attached thereto to prepare a solar cell module. The resulting solar cell module was subjected to a damp heat test in the condition of 85° C., 85% RH and 1000 hours. The retention rate of power generation efficiency before and after the test was calculated. The solar cell module of Example 9 had a retention rate of power generation efficiency of 97%.

Comparative Example 11

The retention rate of power generation efficiency before and after the damp heat test was calculated in the same manner as in Example 9 except for using the film F-11 prepared in Comparative Example 8 instead of the film F-1. The solar cell module had a retention rate of power generation efficiency of 85%.

INDUSTRIAL APPLICABILITY

When used as an intermediate film for a laminated glass, the plasticized polyvinyl acetal film of the present invention described above can provide a laminated glass which exhibits a low degree of yellowness and excellent appearance. The plasticized polyvinyl acetal film of the present invention permits high-temperature lamination and thus ensures excellent productivity, and also can prolong the life of the resulting a solar cell module or laminated glass provided with an electrochromic function.

The invention claimed is:

1. A laminated glass comprising, as an intermediate film of the laminated glass, a plasticized polyvinyl acetal film, the plasticized polyvinyl acetal film comprising 15 to 60 parts by mass of a plasticizer and 100 parts by mass of a polyvinyl acetal resin, and the plasticized polyvinyl acetal film having an acid value after heating at 140° C. for 4 hours of 10.0 meq/kg or less, as measured in accordance with JIS 6728:1977;

wherein the plasticized polyvinyl acetal film has an acid value before heating at 140° C. for 4 hours of 5.0 meq/kg or less, as measured in accordance with JIS 6728:1977.

2. The laminated glass according to claim 1, wherein the combined total number of carbon atoms and oxygen atoms in a molecule of the plasticizer is greater than or equal to 28.

3. The laminated glass according to claim 1, wherein the combined total number of carbon atoms and oxygen atoms in a molecule of the plasticizer is greater than 29.

4. The laminated glass according to claim 1, wherein the plasticizer is represented by the following chemical formula (1):

$$R^2-X-R^1-Y-R^3 \qquad (1)$$

in which $R^1$ is a divalent saturated hydrocarbon group optionally containing an oxygen atom, $R^2$ and $R^3$ are a linear or branched saturated hydrocarbon group optionally containing an oxygen atom, which may be the same or different, and X and Y are COO or OCO, and may be the same or different.

5. The laminated glass according to claim 1, the plasticized polyvinyl acetal film containing a total of 50 ppm or less of chloride ions, sulfate ions, and nitrate ions.

6. The laminated glass according to claim 1, wherein before heating, the polyvinyl acetal resin has an acid value of 3.0 meq/kg or less and the plasticizer has an acid value of 10.0 meq/kg or less, as measured in accordance with JIS K 6728:1977.

7. A method for producing a laminated glass according to claim 1, comprising:

mixing 15 to 60 parts by mass of a plasticizer with 100 parts by mass of a polyvinyl acetal resin to form a mixture, and molding the mixture;

wherein the combined total number of carbon atoms and oxygen atoms in a molecule of the plasticizer is greater than or equal to 28.

8. The method for producing a laminated glass according to claim 7, wherein the combined total number of carbon atoms and oxygen atoms in a molecule of the plasticizer is greater than 29.

9. The method for producing a laminated glass according to claim 7, wherein the polyvinyl acetal resin has an average primary particle size of 10 μm or less.

10. The method for producing a laminated glass according to claim 7, wherein before heating, the polyvinyl acetal resin has an alkali titer value of 0.1 to 30 and an acid value of 3.0 meq/kg or less, as measured in accordance with JIS K 6728:1977.

11. The method for producing a laminated glass according to claim 7, wherein the polyvinyl acetal resin contains a total of 100 ppm or less of chloride ions, sulfate ions, and nitrate ions.

12. The method for producing a laminated glass according to claim 7, wherein the polyvinyl acetal resin is prepared by first adding aldehyde to an aqueous solution of a polyvinyl alcohol resin and then adding a catalyst.

13. The method for producing a laminated glass according to claim 7, wherein a plasticizer having an acid value of 10.0 meq/kg or less, as measured in accordance with JIS K 6728:1977, is mixed with a polyvinyl acetal resin having an acid value of 3.0 meq/kg or less, as measured in accordance with JIS K 6728:1977, to form a mixture, and the mixture is molded.

14. The method for producing a laminated glass according to claim 7, wherein a volatile component is removed by reducing pressure while mixing the polyvinyl acetal resin and the plasticizer.

15. The method for producing a laminated glass according to claim 7, wherein the temperature of the resin during molding ranges from 150 to 220° C.

16. The laminated glass according to claim 1, further comprising a functional unit at a position in contact with the plasticized polyvinyl acetal film.

* * * * *